United States Patent [19]

Henderson et al.

[11] Patent Number: 5,386,126

[45] Date of Patent: Jan. 31, 1995

[54] SEMICONDUCTOR DEVICES BASED ON OPTICAL TRANSITIONS BETWEEN QUASIBOUND ENERGY LEVELS

[76] Inventors: Gregory H. Henderson, 3510 Buford Hwy., Apt. N1, Atlanta, Ga. 30329; Lawrence C. West, 4 Quail Hill, Clarksburg, N.J. 08510; Thomas K. Gaylord, 3180 Verdun Dr., NW., Atlanta, Ga. 30305; Charles W. Roberts, 484 Shrewsbury Ave., Tinton Falls, N.J. 07701; Elias N. Glytsis, 3510 Buford Hwy., R-19, Atlanta, Ga. 30329; Moses T. Asom, 7619 Brandywine Cir., P.O. Box 733, Trexlertown, Pa. 18087

[21] Appl. No.: 11,010

[22] Filed: Jan. 29, 1993

[51] Int. Cl.⁶ .................. H01L 29/161; H01L 27/14; H01L 27/12
[52] U.S. Cl. ........................... 257/15; 257/14; 257/21; 257/25; 257/26
[58] Field of Search ............ 372/45, 46; 257/14, 257/15, 17, 21, 25, 26, 94

[56] References Cited

U.S. PATENT DOCUMENTS

| | | | |
|---|---|---|---|
| 4,985,737 | 1/1991 | Gaylord et al. | 257/15 |
| 4,987,458 | 1/1991 | Gaylord et al. | 257/22 |
| 5,031,013 | 7/1991 | Choi | 257/14 |
| 5,068,868 | 11/1991 | Deppe et al. | 257/14 |
| 5,121,181 | 6/1992 | Smith, III et al. | 257/21 |
| 5,132,750 | 7/1992 | Kato et al. | 257/15 |

OTHER PUBLICATIONS

Yokoyama et al., "Enhanced spontaneous emission . . . microcavities", Appl. Phys. Lett. 57(26), Dec. 24, 1990.
Lenz et al., "Bragg confinement of carriers in a quantum barrier", Appl. Phys. Lett. 56(9), Feb. 26, 1990.
Kazarinov and Suris–Possibility of the Amplification of Electromagnetic Waves in a Semiconductor With a Superlattice, vol. 5, No. 4., Oct. 1971, Soviet Physics–Semiconductors.
West and Eglash–First Observation of an Extremely Large–Dipole Infrared Transition Within the Conduction Band of a GaAs Quantum Well–Apply. Phys. Lett. 46 (12), 15 Jun. 1985).
Helm and Allen–Can Barriers With Inverted Tunneling Rates Lead to Subband Popoulation Inversion?, Appl. Phys. Lett. 56 (14), 2 Apr. 1990.
Herrick–Construction of Bound States in the Continuum For Epitaxial Heterostructure Superlattices–Physica 85B, (1977), 44–50.
Stillinger–Potentials Supporting Positive–Energy Eigenstates and Their Application to Semiconductor Heterostructures, Physica 85B, (1977), 270–276.
Ballistic Electron Transport in Semiconductor Heterostructures and its Analogies in Electromagnetic Propagation in General Dielectrics–Henderson, Gregory–Proceedings of the IEEE, vol. 79, No. 11, Nov. 1991, 1643–1659.
Gaylord and Brennan–Semiconductor Superlattice Electron Wave Interference Filters–Appl. Phys. Lett 53 (21), Nov. 21, 1988.
Gaylord an Glytsis and Brennan–Semiconductor Superlattice Interference Filter Design–J. Appl. Phys. 65 (6), 15 Mar. 1989.
Glytsis, Gaylord & Brennan–Theory and Design of Semiconductor Electron Wave Interference Filter-/Emitters–J. Appl. Phys. 66 (12), 15 Dec. 1989.
Sirtori, Capasso, Faist, Sivco, Chu, Cho–Quantum Wells With Localized States at Energies Above the Barrier Height; A Fabry–Perot Electron Filter–Appl. Phys. Lett 61 (8), 24 Aug. 1992.

Primary Examiner—Rolf Hille
Assistant Examiner—Minhloan Tran
Attorney, Agent, or Firm—Deveau, Colton & Marquis

[57] ABSTRACT

A solid state, electronic, optical transition device includes a multiple-layer structure of semiconductor material which supports substantially ballistic electron/hole transport at energies above/below the conduction/valance band edge. The multiple layer structure of semiconductor material includes a Fabry-Perot filter element for admitting electrons/holes at a first quasibound energy level above/below the conduction/valance band edge, and for depleting electrons/holes at a second quasibound energy level which is lower/higher than the first energy level. Such an arrangement allows common semiconductor material to be used to produce emitters and detectors and other devices which can operate at any of selected frequencies over a wide range of frequencies.

45 Claims, 8 Drawing Sheets

SEMICONDUCTOR DEVICES BASED ON OPTICAL TRANSITIONS BETWEEN QUASIBOUND ENERGY LEVELS

The present invention was made with partial government support under Contract No. DAAL-03-90-C-0004 from the Joint Services Electronics Program, No. ECS-9111866 from the National Science Foundation, and No. DAAL-03-90-C-0019 from DARPA. The Government has certain rights in this invention.

TECHNICAL FIELD

The present invention relates generally to quantum mechanical semiconductor devices, and in particular to devices involving an energy transition which results in the emission or absorption of light.

BACKGROUND OF THE INVENTION

Known lasers, and other such emitters, have generally suffered from being capable of producing energy output only at very specific frequencies and wavelengths. The reason for this is best explained with a short discussion from the field of physics known as quantum mechanics.

Quantum mechanics tells us that electrons in materials can exist at different energy levels (states). When an electron makes a transition from a higher energy level to a lower energy level, radiation energy is emitted. Conversely, when radiation is absorbed the electron makes a transition from a lower energy level to a higher energy level. In each instance, the transition energy (i.e., the difference between the two energy levels) dictates the wavelength and frequency of the light radiated or absorbed.

In conventional semiconductor lasers, electrons make a transition from an energy level near the conduction band edge (an energy level at which the electrons can propagate through the material to result in electrical conduction) to an energy level near the valence band edge (a lower energy level). The net difference between these two levels varies with the host material. As a consequence, in order to change the frequency and wavelength of known lasers, one must use a different material, which all too often points to using undesirable or hazardous materials. Further, while there is a specific frequency (and thus wavelength) for each material, there is not a material for every frequency. Thus, the frequencies available to the designers and users of lasers have been rather limited. Moreover, for each material the transition occurs only from a very narrow range of higher energy levels to a very narrow range of lower energy levels, and vice versa. The implication of this is that for a laser of a particular material, only a very narrow band of frequencies and wavelengths can be produced.

Semiconductor fabrication techniques have advanced to the point that it is now possible to construct semiconductor structures made up of exceedingly thin layers, the layers being as thin as only a few atoms thick. Such precise fabrication capabilities have allowed for the investigation and development of so-called "quantum wells" in semiconductor structures. In a simple quantum well structure, a narrow band gap semiconductor layer is surrounded by regions of wide band gap semiconductor. A potential energy graph for such a structure resembles a deep, narrow trough, hence the name quantum "well". Quantum well lasers have been produced based on optical transitions from bound electron energy levels in the conduction band quantum well to bound electron energy levels in the corresponding valence band quantum well.

However, a quantum well can also be formed by two finite-thickness potential energy barriers (thin layers of electron high potential energy material) positioned on opposite sides of an electron low potential energy material. Given two energy states (levels) in a quantum well formed by two finite-thickness potential barriers, elementary quantum mechanics tells us that the lower energy state is more tightly bound than the upper state. This produces a longer electronic lifetime in the lower state than in the upper state (i.e., the electrons tend to stay in the lower state longer than in the upper state). This ratio of lifetimes is opposite that needed for laser action between these states. Further, the lifetime of the lower energy state must be significantly shorter than the electron scattering time in order to be able to deplete the electrons from the well. This fast depletion is also required for laser action. These facts have blocked the development of general-purpose lasers based on these transitions in a quantum well semiconductor structure.

A "quasibound" electron energy level in a multilayer semiconductor quantum device is an electron energy state that lies above the conduction band edges of the materials surrounding the quantum device structure. Electrons at these energies are traveling waves. These energy states are characterized by mathematically complex energy eigenvalues. By contrast, a "bound" electron energy level in a multilayer semiconductor quantum device is an electron energy level that lies below the conduction band edges of the materials surrounding the quantum device structure. Electrons at these energies are standing waves. These energy states are characterized by mathematically real energy eigenvalues. Quasibound hole energy levels are similarly defined below the valence band edge. A quasibound level may be above all conduction band edges of the multilayer quantum structure. A quasibound level may be in the conduction band and below one or more conduction band edges of the multilayer structure. Similarly, a quasibound level may be in the valence band below all valence band edges of the multilayer quantum structure or may be in the valence band above one or more valence band edges of the multilayer structure. In the literature, some quasibound electron states are also called "extended" states or "virtual" states if they lie above all conduction band edges in the multilayer structure. Quasibound states are analogous to leaky-guided modes in electromagnetic waveguides.

In 1971, investigators Kazarinov and Suris first proposed the use of semiconductor superlattices for infrared emitters. Kazarinov, R. F. & Suds, K. A. *Sov. Phys. Semicond.* 5, 707–709 (1971). In 1984, researchers West and Eglash observed large dipole infrared transitions in semiconductor quantum wells. West, L. C. & Eglash, S. J. *Appl. Phys. Lett.* 46, 1156–1158 (1985). Since then, a variety of structures have been proposed for intersubband emitters and lasers. Spontaneous emission between two quantum well levels has been observed in a GaAs/GaAlAs structure. However, no intersubband laser has been developed at the present time. This is primarily due to the difficulty in obtaining "population inversion" between the subband states in a quantum well. Population inversion requires the upper energy level to be more tightly bound than the lower energy level. Recall from the discussion above that the opposite is the usual case. Previously proposed structures have relied on electron tunneling for admission into the upper energy state and for depletion from the lower energy state.

Investigators Helm and Allen have shown that it is difficult to achieve population inversion when a tunneling scheme is used. Helm, M. & Allen, S. J. *Appl. Phys. Lett.* 56, 1368–1370 (1990). An example of a prior art electron tunneling structure is shown in FIG. 1. Generally, electron tunneling can occur across a thin potential barrier from one side of this barrier where a large number of electrons are available to a large number of empty states on the other side of the barrier.

In 1977 researchers Herrick and Stillinger proposed the existence of above-barrier quasibound states in semiconductor heterostructures. Herrick, D. R. *Physica B* 85, 44–50 (1977). Stillinger, F. H. *Physica B* 85, 270–276 (1977). Recently, some of the present inventors have developed exact quantitative analogies between electron wave propagation in semiconductors and electromagnetic wave propagation in dielectrics. Henderson, G. N, Gaylord, T. K. & Glytsis, E. N. *Proc. IEEE* 79, 1643–1659 (1991). Simultaneously, some of the present inventors have developed a quantitative procedure for designing electronwave Fabry-Perot interference filters using standard thin film optical techniques. Gaylord, T. K. & Brennan, K. F.: *Appl. Phys. Lett.* 53, 2047–2049 (1988); *J. Appl. Phys.* 65, 2535–2540 (1989); *J. Appl. Phys.* 66, 6158–6167 (1989).

From the above, it can be seen that a need yet remains for a new class of emitters, detectors and other devices which utilize optical transitions between quasibound states and which are not limited to only certain specific wavelengths and frequencies. It is to the provision of such devices that the present invention is primarily directed.

SUMMARY OF THE INVENTION

Briefly described, the present invention comprises a solid state, electronic, optical transition device which includes a multiple layer structure of semiconductor material which supports substantially ballistic electron transport at energies above the conduction band edge or supports substantially ballistic hole transport at energies below the valence band edge for an optical emitter based on ballistic electron transport, the multiple layer structure of semiconductor material includes filter means for admitting electrons at a first quasibound energy level above the conduction band edge and for depleting electrons at a second quasibound energy level. The second energy level is lower than the first energy level. Preferably, the second energy level is less tightly bound than the first energy level. Also preferably, the filter means comprises a first filter element including a potential energy barrier adapted to admit electrons at the first energy level, an additional filter element comprising a layer having a thickness of ½ of the first electron wavelength and another filter element including one or more layers each having a thickness of ¼ of the first electron wavelength. Collectively, these filter elements operate to admit substantially only electrons at energy levels corresponding to the desired working electron wavelength. The working electron wavelength of the filter can be adjusted by changing the thicknesses of the second and third filter elements, etc.

Preferably, the transport lifetime for electrons at the second energy level is shorter than the times for any competing process, i.e., the transport lifetimes are shorter than relaxation times associated with these energy levels.

For an optical detector based on ballistic electron transport, the multiple layer structure of semiconductor material includes filter means for accumulating electrons at a first quasibound energy level above the conduction band edge and a second quasibound energy level for depleting electrons. The second energy level is higher than the first energy level. Preferably, the filter means comprises a first filter element including a potential barrier adapted to reflect electrons at a second wavelength corresponding to the second electron energy level, a second filter element comprising a layer having a thickness of ½ of the second wavelength, and a third filter element including one or more layers each having a thickness of ¼ of the second wavelength. Collectively, these filter elements operate to absorb electromagnetic optical waves by exciting electrons from the lower first energy level to the higher second energy level and then depleting them from the second energy level. The optical wavelength absorbed can be adjusted by changing the thickness of the second and third filter elements, etc.

The optical emitter device and the optical detector device based on ballistic electron transport as described above have a common structure.

With this structure, one can design an emitter (e.g., a laser) or a detector or other device to operate at any of a number of frequencies and wavelengths. With this structure, the wavelength and frequency of operation is not directly tied to the host material as described previously. In essence, this changes the emitter and detector design problem from one of a materials engineering problem (with very severe limitations in terms of wavelength) to one of filter design to pick an appropriate frequency for the application at hand.

Proper design techniques, discussed in the application, allow the upper energy level, as well as the lower energy level, to be selected, although the relationship between the physical parameters of the filter elements and the wavelength corresponding to the lower energy level generally is not as straightforward as that for the upper energy level.

In addition to the tremendous improvement in flexibility in terms of the wavelength/frequency of operation of the devices, the present invention also allows for a small size of the device. For example, previous known semiconductor lasers in the 10 micrometer wavelength range have tended to be rather large, while lasers built according to the present invention would tend to be much, much smaller. Also, since the present devices do not depend upon the build up of an electrical charge like typical semiconductor lasers and prior quantum well lasers, these devices would have much greater modulation speed which would be useful in communications. Further, because of the small size, power consumption would be low.

Accordingly, it is the primary object of the present invention to provide a solid state, electronic, optical transition device which is capable of being constructed to achieve operation over a wide range of frequencies and wavelengths.

It is another object of the invention to provide a solid state, electronic, optical transition device which is compact and capable of high speed operation.

It is another object of the present invention to provide a solid state, electronic, optical transition device which can be constructed as an emitter or detector to operate at a given wavelength and frequency and which can be constructed of ordinary semiconductor materials rather than requiring the device to be made of semiconductor materials chosen for a specific frequency and wavelength.

These and other objects, features, and advantages of the present invention will become more apparent upon reading the following specification in conjunction with the accompanying drawing figures.

BRIEF DESCRIPTION OF THE DRAWING FIGURES

DETAILED DESCRIPTION

Figure 1:
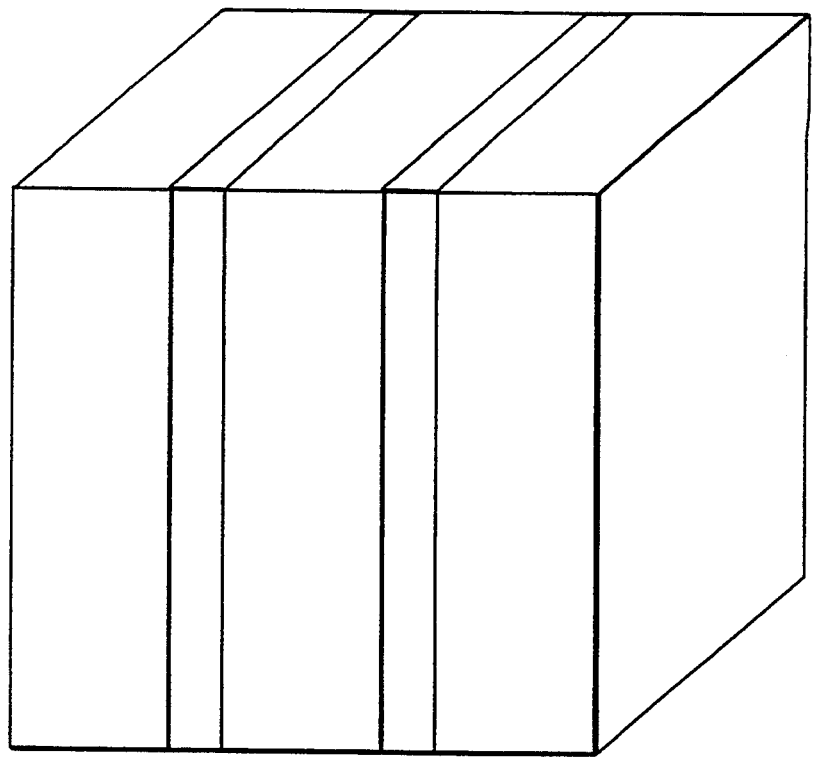
FIG. 1 is a perspective, schematic illustration of a prior art quantum well device.
Figure 2A:
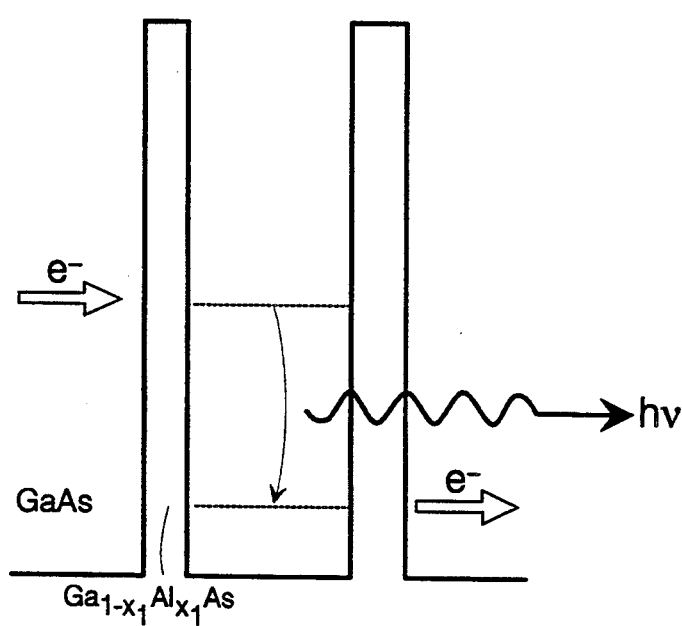
FIGS. 2A and 2B are schematic, energy diagram and characteristics of the prior art device of FIG. 1.
Figure 2B:
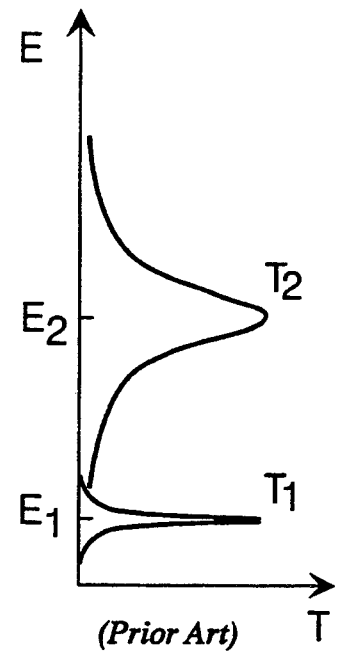

Referring now in more detail to the drawing figures, wherein like reference numerals depict like parts throughout the several views, a prior art device is depicted in FIGS. 1, 2A, and 2B and the present invention is depicted in FIGS. 3-7.

Turning now to FIGS. 1, 2A, and 2B, an example of a prior art tunneling structure is depicted, both in structure and operation. It consists of two 8-monolayer-thick barriers of $Ga_{0.60}Al_{0.40}As$, a 31-monolayer thick well of GaAs, and surrounding material that is also GaAs. The individual electron transmittances ($T_1$ and $T_2$) through this structure consist of a narrow peak centered at energy $E_1 (=37.5$ meV) and a wide peak centered at $E_2$ ($=151.3$ meV). The lower energy state is more tightly bound than the upper state. The electronic lifetime ($\tau$) of a state is inversely proportional to the full-width-at-half-maximum (FWHM) of the state transmittance. In this example, $\tau_1 = 493$ fs and $\tau_2 = 59$ fs. The ratio of these lifetimes is opposite to that needed for laser action. A second factor contributing to the lack of success of the device of FIG. 1 as a laser is due to the fact that the tunneling time is too long to deplete efficiently the lower energy state. The transport lifetime of the lower state must be less than any relaxation times (associated with LO phonon emission, electron-electron scattering, etc.) which may be from a few hundred femtoseconds to ten picoseconds.

Figure 6:
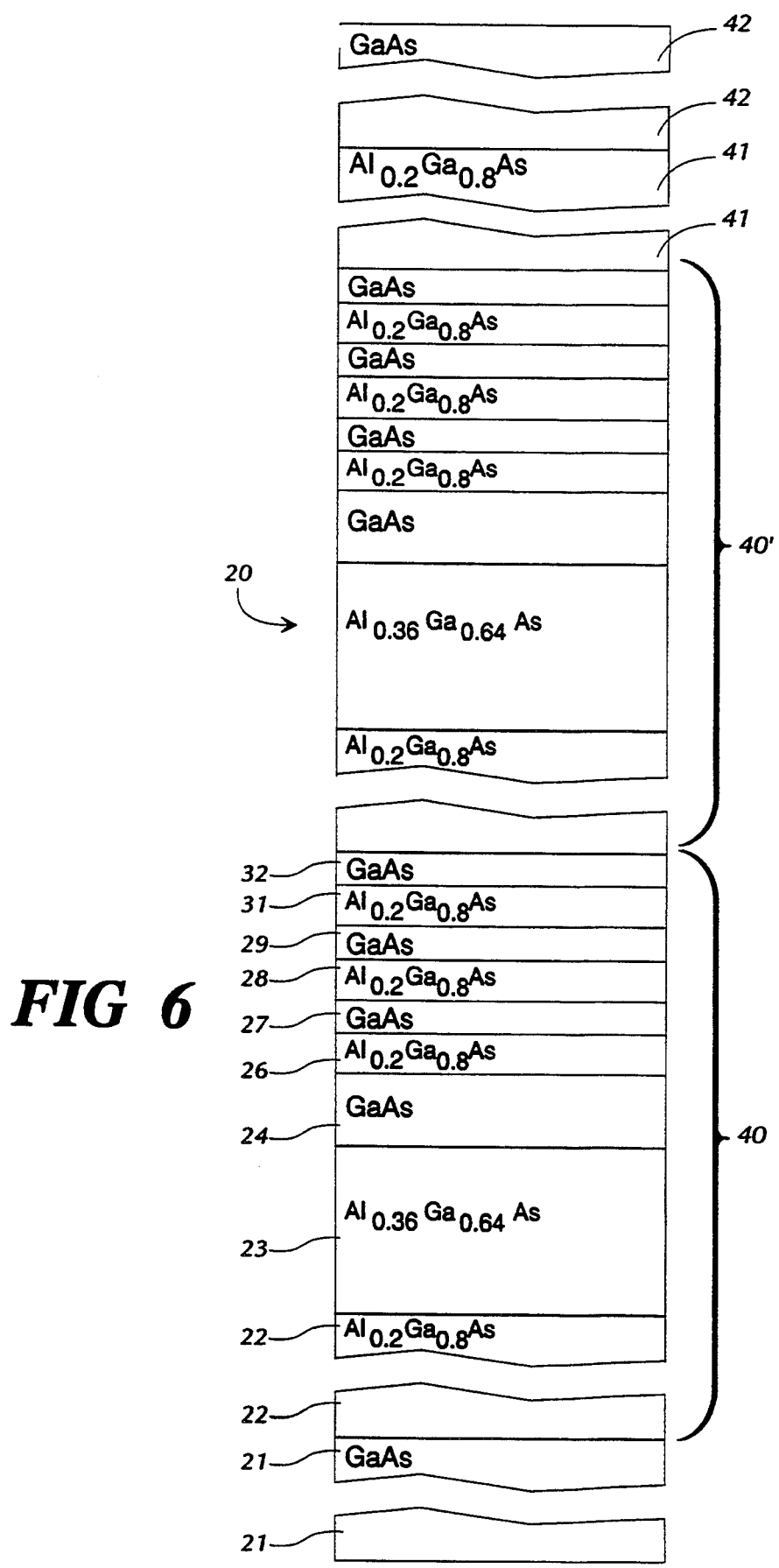
FIG. 6 is a cross-sectional, schematic illustration of the physical structure of a device constructed in accordance with the principles of the present invention.

Referring now to FIGS. 3A through FIG. 6, an exemplary device according to a preferred form of the invention is disclosed. FIG. 4A shows the device operating as an optical emitter based on ballistic electron transport. FIG. 4C shows the device operating as an optical detector based on ballistic electron transport. It is pointed out that these drawings show and this specification describes the synthesis and characterization of a novel asymmetric electron-wave Fabry-Perot interference filter that allows for population inversion between two above-barrier quasibound states. This represents the first use of optical transitions between above-barrier quasibound states in a semiconductor heterostructure known to the applicants. In addition, it represents the first known use of these above-barrier quasibound states in the development of infrared lasers. By using above-barrier states for both the upper and lower states (designed to be separated by 110 meV), the lower state was successfully designed to have a transport lifetime less than 100 fs to allow for fast depletion out of the structure. In addition, the upper state was designed to have a transport lifetime greater than three times that of the lower state, allowing for laser action. The filter was grown in an MBE (molecular beam epitaxy) system using very high purity sources. Thirty periods were grown on a (100) oriented semi-insulating GaAs substrate, where each period consisted of the filter and a 56 nm $Al_{0.2}Ga_{0.8}As$ spacer as shown in FIG. 6.

The existence of above-barrier quasibound states in semiconductor heterostructures was first proposed by Herrick and Stillinger. D. R. Herrick, Physica 85B, 44 (1977). F. H. Stillinger Physica 85B, 270 (1977). Recently, using exact analogies between electron wave propagation in semiconductors and electromagnetic wave propagation in dielectrics, a quantitative procedure was developed by some of the present inventors for designing electron-wave energy filters using standard thin film optical design techniques. G. N. Henderson, T. K. Gaylord, and E. N. Glytsis, Proc. IEEE 79, 1643 (1991). T. K. Gaylord and K. F. Brennan, Appl. Phys. Lett. 53, 2047 (1988). T. K Gaylord, E. N. Glytsis, and K. F. Brennan, J. Appl. Phys. 65, 2535 (1989). The filter shown in FIG. 5 was designed using this procedure. This filter, the electron wave analog of an electromagnetic interference filter, was designed to be resonant at the upper state energy of 272 meV (above the GaAs conduction band edge). At this energy, the 16 monolayer GaAs region is a half-wavelength resonant layer and the right-hand layers are quarter-wave reflectors. The barrier on the left of the structure provides selective electrical injection (admission) into the upper state. An electron at 272 meV is confined inside the resonant layer by constructive interference of the waves reflected by the quarter-wave stack. Recent bound-to-quasibound optical absorption measurements of a symmetric energy filter demonstrated clear confinement in the resonant state above the barriers. C. Sirtori, F. Capasso, J. Faist, D. L. Sivco, S. N. G. Chu, and A. Y. Cho, Appl. Phys. Lett. 61, 898 (1992). The lower energy above-barrier state (166 meV) is a quasibound state which has a low transport lifetime due to the lower reflectivity of the quarter-wave stack.

Turning now specifically to FIG. 6, a device 20 according to the present invention is schematically depicted. The device 20 depicted in FIG. 6 consists of a large number of layers of semiconductor material built up by molecular beam epitaxy (MBE). The layers, of course, are actually much thinner than that depicted in the scale of the drawing figure, and the lateral dimensions of FIG. 6 do not represent the actual size of a practical device constructed. Device 20 is built up upon a substrate 21 of GaAs semiconductor material. Atop the substrate 21 is grown a spacer 22 of $Al_{0.2}Ga_{0.8}As$. Next is grown a 48-monolayer-thick barrier 23 of $Al_{0.36}Ga_{0.64}As$. Next is grown a half wavelength resonant layer 24 of GaAs.

After the one half electron wavelength resonant layer 24, a series of layers of one quarter electron wavelength material are grown. For example, a one quarter wavelength layer 26 of $Al_{0.2}Ga_{0.8}As$ is grown atop the one half electron wavelength resonant layer 24. Next comes another one quarter wavelength layer 27 made up of GaAs. This pair of one quarter wavelength layers 26 and 27 is repeated two more times with layers 28, 29, 31 and 32. Each of the $Ga_{0.8}Al_{0.2}As$ quarter wavelength layers 26, 27 and 31 is 10 monolayers thick. Each of the GaAs quarter wavelength layers 27, 29, and 32 is 8 monolayers thick.

As has been previously discussed briefly in the application, one of the primary features or advantages of the present invention is that the device can be made to operate at any of a wide range of wavelengths. Once a desired wavelength is chosen, the physical dimensions of the above-mentioned layers are set in relation thereto. Of course, for each selected wavelength, there is a corresponding frequency which is related thereto by wellknown physical laws. When speaking about a layer being "a quarter wavelength thick" or using some other similar notation, it is to be understood that this refers to a thickness which corresponds to one quarter of an electron wavelength in that material. This recognizes that waves have different wavelengths in different materials.

Collectively, elements 22 through 32 make up a repeating structure or grouping 40. For example, 30 periods of this structure were grown in a device constructed according to the present invention. Such is schematically depicted in FIG. 6 by grouping 40 and grouping 40'. These 30 periods of the groupings 40, 40', etc. were terminated with a spacer layer 41 of $Ga_{0.8}Al_{0.2}As$ being some 56 nm thick. This was then capped off with a thick GaAs cap 42.

Referring now to FIG. 3 A, the repeating structure or grouping 40 is depicted more specifically. FIG. 3 A shows the spacer 22, the barrier 23, the half wavelength resonant layer 24, and the stack of quarter wavelength reflective layers 26, 27, 28, 29, 31, and 32. Also shown is another spacer, 22'.

Figure 3A:
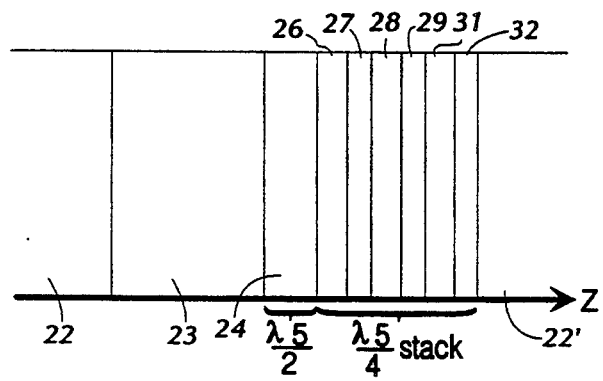
FIGS. 3A-3C are schematic diagrams of a portion of the structure, the potential energy, and effective mass, respectively, of an exemplary semiconductor device according to a preferred form of the invention.
Figure 3B:
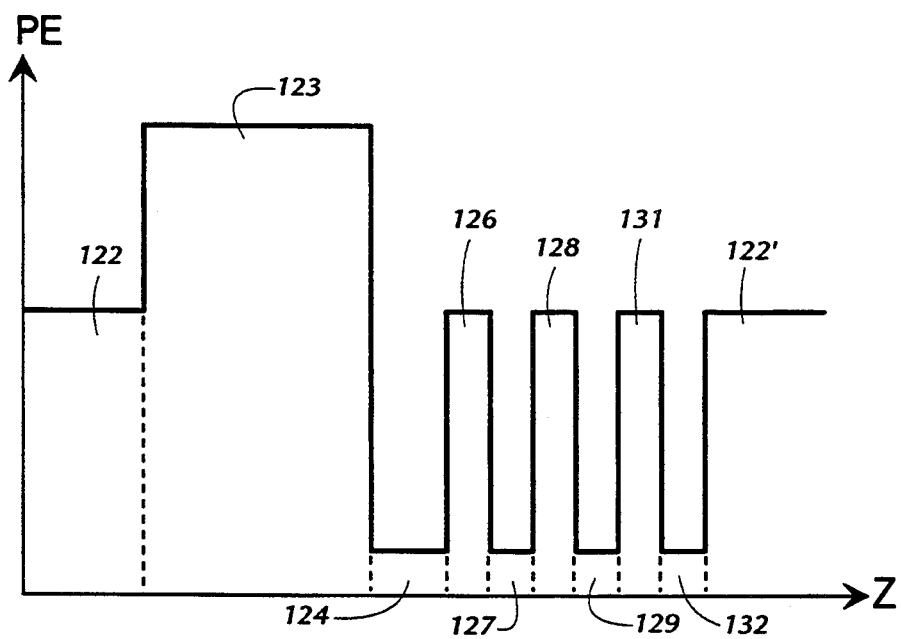
Figure 3C:
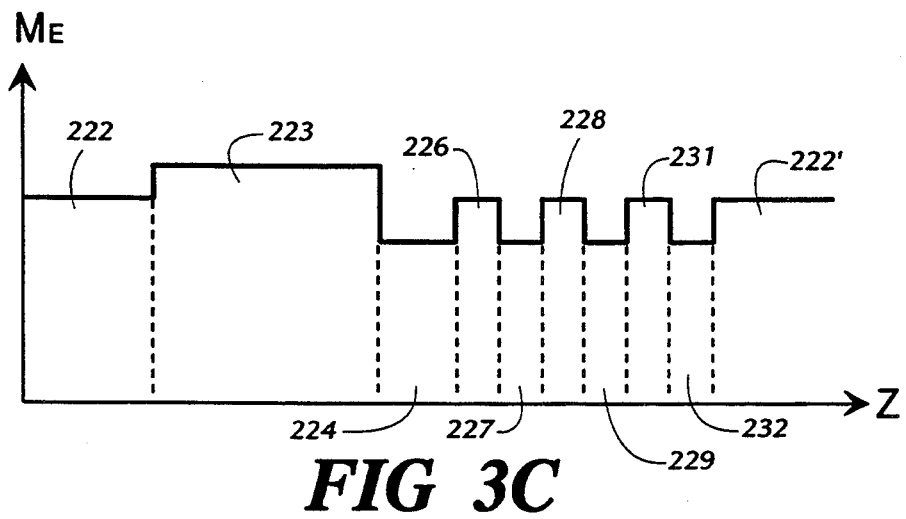

FIG. 3A is vertically aligned with FIG. 3B and FIG. 3C, with FIG. 3A showing the structure and cross-section of an exemplary device, while FIG. 3B shows the potential energy graph across that structure and FIG. 3C shows an effective mass graph across that same structure. For example, the potential energy shown in FIG. 3B in the region of the barrier 23 represents a substantial potential energy barrier indicated at 123. The GaAs half wavelength resonant layer 24 has a low potential energy in the region 124. Also, the quarter wave filter elements 27, 29 and 32, made of GaAs, likewise have low potential energy in the corresponding regions 127, 129, and 132. Further, the $Ga_{0.8}Al_{0.2}As$ quarter wavelength reflective layers 26, 28, and 31 have relatively high potential energy values as shown in regions 126, 128, and 131. Collectively, the spacers 22 and 22' establish a background level of potential energy in regions 122 and 122'.

FIG. 3C shows the effective mass for the structure of FIG. 3A, with the regions 222, 223, 224, 226, 227, 228, 229, 231, 232, and 222' corresponding to the structural elements depicted in FIG. 3A in much the same manner as the regions depicted in FIG. 3B of the potential energy.

Figure 4A:
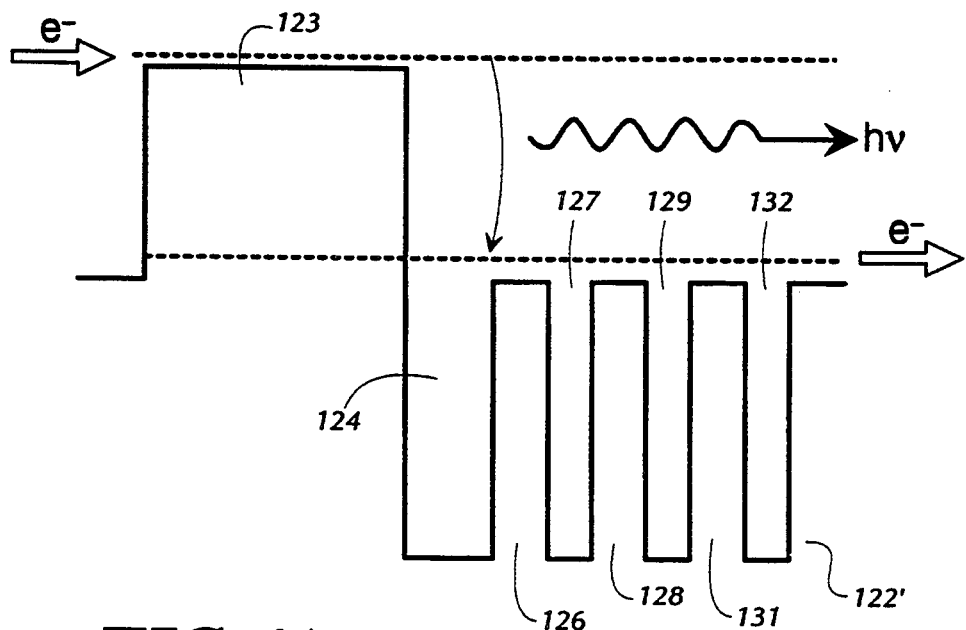
FIGS. 4A and 4B are energy diagram and characteristics corresponding to the optical emitter device depicted in FIGS. 3A-3C.
Figure 4B:
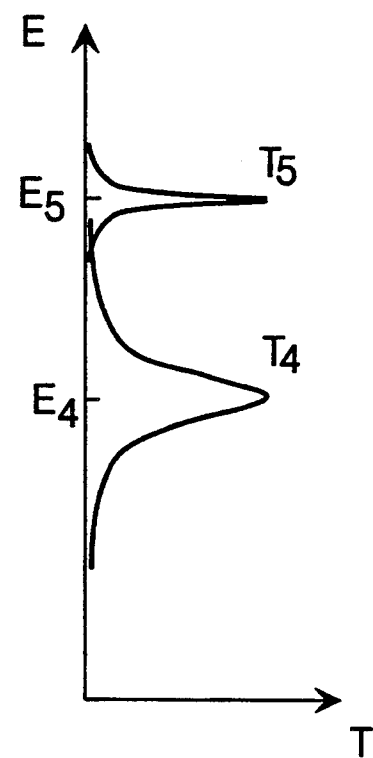
Figure 4C:
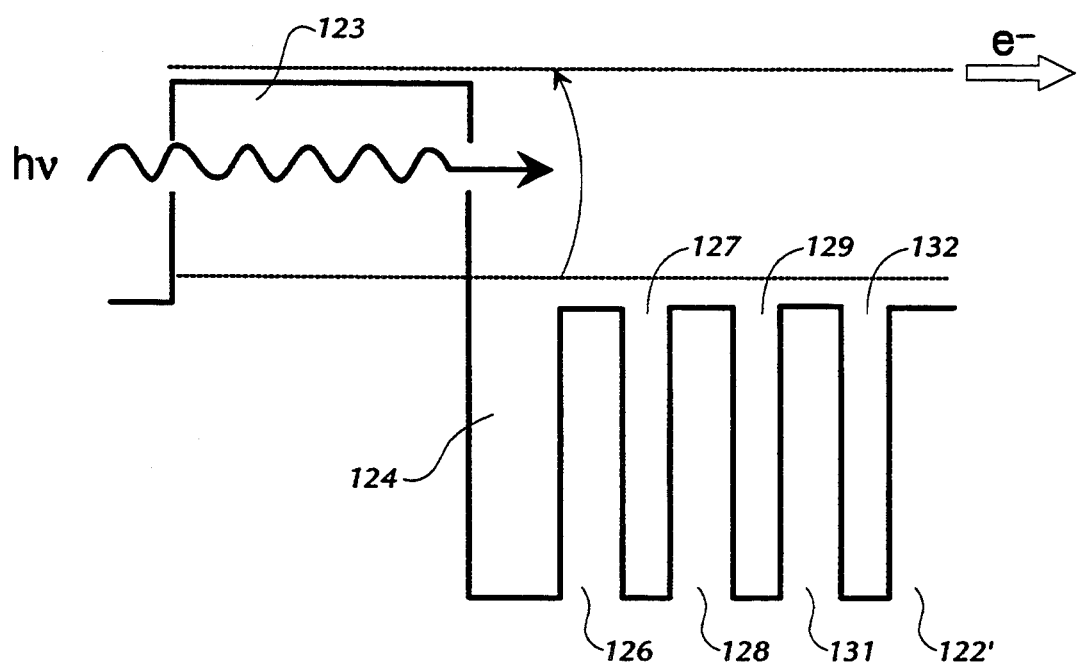
FIG. 4C is an energy diagram corresponding to the optical detector device depicted in FIGS. 3A-3C.
Figure 5:
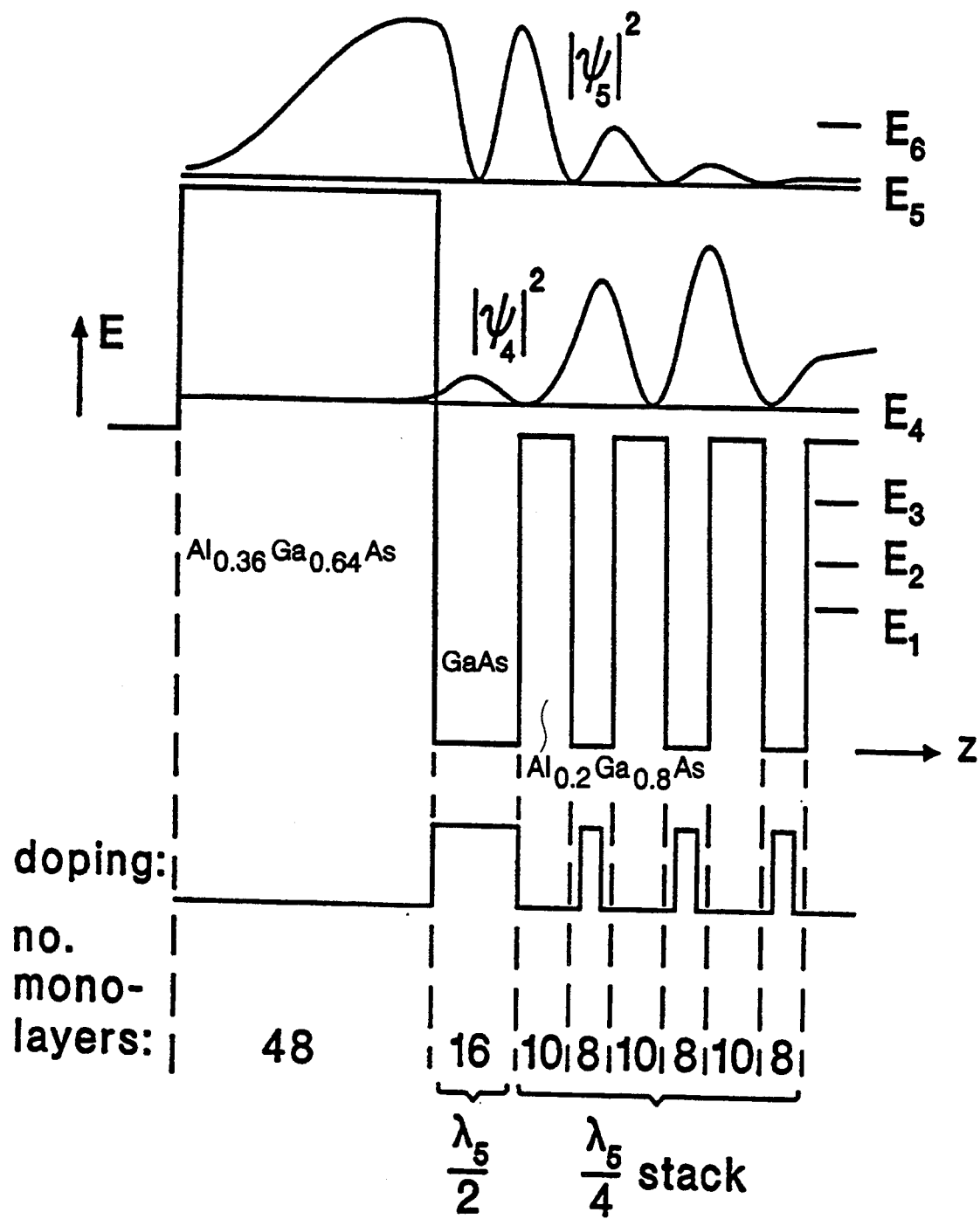
FIG. 5 is a schematic energy diagram corresponding to the semiconductor device of FIG. 3A, with some structural detail superimposed thereon.

FIG. 4A shows the device of the present invention operating as an optical emitter based on ballistic electron transport. FIG. 4A and FIG. 4B collectively show that the potential energy in the region of 123 (corresponding to the barrier 23) and the half wavelength region 124 and the quarter wavelength regions 126, 127, 128, 129, 131, and 132 collectively operate to act as band pass filters to admit only electrons at a first selected energy level, which is above the background energy levels established by the spacers 22 and 22'. This energy level, $E_5$, shown in FIG. 4B, also is above the potential energy barrier in region 123. By known principles of optics, the half wavelength resonant layer 124 is tuned to resonate or admit energy substantially only at this upper energy level, $E_5$. Likewise, the quarter wavelength stack made up of regions 126, 127, 128, 129, 131, and 132 is tuned so that each of these layers acts as a quarter-wavelength reflector for energy at the wavelength $E_5$. Collectively, the half wavelength resonant layer and the quarter wavelength reflective layers make up what is known in the art of optics as a "Fabry-Perot" interference filter. The use of such an interference filter in the present environment works to admit electrons at energy level $E_5$ and also operates to deplete electrons at energy level $E_4$. FIG. 4C shows the same type of device operating as an optical detector based on ballistic electron transport. The device includes filter means for accumulating electrons at a first quasibound energy level above the conduction band edge and a second quasibound state for depleting electrons at a second quasibound energy level. The second energy level is higher than the first energy level. Preferably, the filter means comprises a first filter element including a potential barrier in the region of 123 which is adapted to reflect electrons at the electron wavelength corresponding to the second energy level, a second filter element (region 124) having a thickness of ½ of the second wavelength, and a third filter element (regions 126, 127, 128, 129, 131, and 132) including one or more layers each having a thickness of ¼ of the second wavelength. Collectively, the filter elements operate to absorb electromagnetic optical waves by exciting electrons from the lower first energy level to the higher second energy level and then depleting them from the second energy level. The optical wavelength absorbed can be adjusted by changing the thickness of the second and third filter elements, etc.

Figure 8:
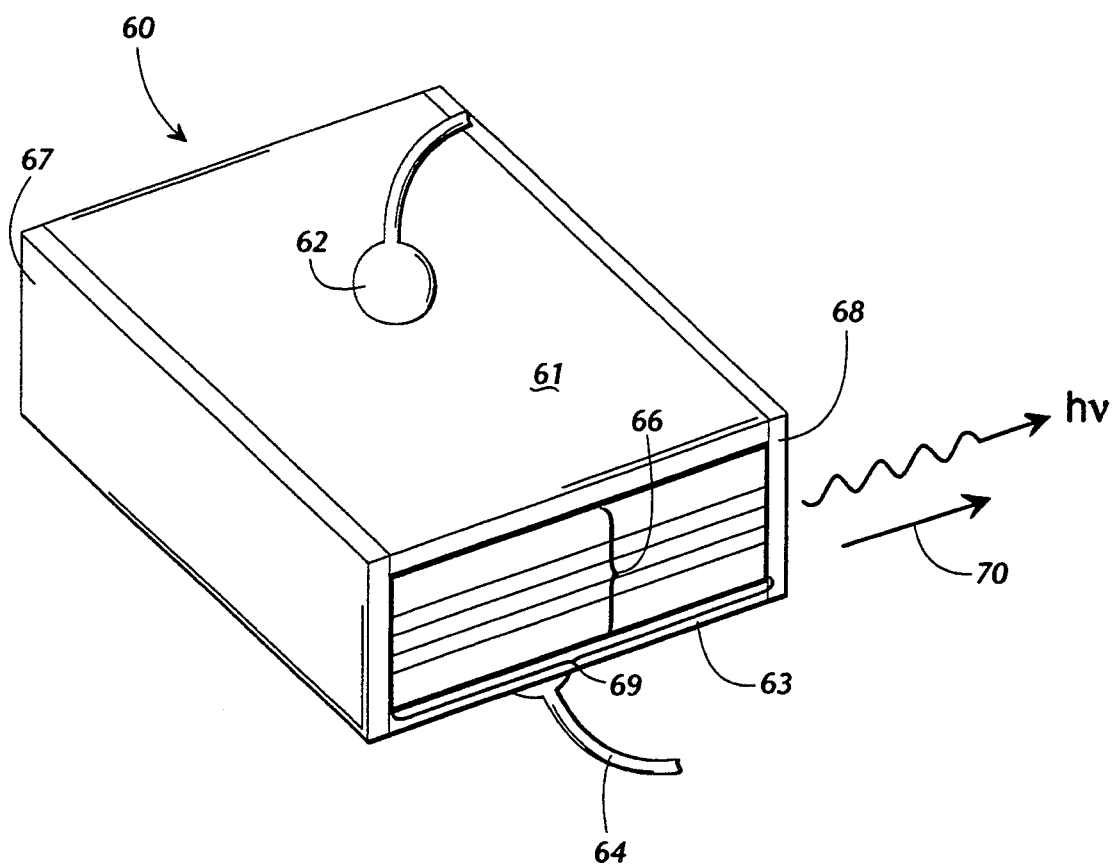
FIG. 8 is a schematic, perspective illustration of a typical laser device according to the present invention.

Referring now to FIG. 8, a typical laser device is depicted in accordance with principles of the present invention. The laser device 60 includes an ohmic contact layer 61, and an electrical lead 62 connected thereto for injecting energy. Another ohmic contact layer 63 is spaced apart from first ohmic contact layer 61, and also is connected with a lead 64. Between the ohmic contact layers 61 and 63 is positioned one or more of the quantum Fabry-Perot filters as previously described (the repeating section depicted in FIG. 6). This is depicted by the layers shown in region 66. Reflective means are placed aside the Fabry-Perot filter elements 66, such as a first reflective element 67 (a facet, mirror, grating, or other means) and a second reflective element 68 (another facet, mirror, grating, or other means) to form a resonant cavity 69. The reflective elements 67, 68 provide a means for feeding back the light into the resonant cavity 69. The result is that the lasting action produces emission of laser light in the direction of direction arrow 70.

DESCRIPTION OF EXPERIMENTAL RESULTS

To verify the practicality of the inventive concepts, experiments were performed. The experiments involved measuring absorption. This represents an expedient way to confirm the existence and practicality of optical transitions between quasibound states. A description of the experiments and their results are as follows.

The two above-barrier quasibound states of the structure are analogous to leakymodes in electromagnetic waveguides. [E. Anemogiannis, E. N. Glytsis, and T. K. Gaylord, *IEEE J. Quantum Electr.* 29 (1993).] The energy eigenvalues ($\epsilon$) for quasibound states are complex and the lifetime ($\tau$) of the state is $\tau = h/2\, \mathrm{Im}(\epsilon)$. [L. D. Landau and E. M. Lifshitz, *Quantum Mechanics, Non-Relativistic Theory*. London: Pergamon Press, 1958.] Using the procedure of Anemogiannis et al., the energies and lifetimes of all the bound and quasibound states were found under the envelope-function approximation by finding the complex energy eigenvalues. These results were corrected for energy-band nonparabolicity by using an energy-dependent effective mass. The structure has three bound states at energies $[E_n = \mathrm{Re}(\epsilon_n)]$ of $E_1 = 69$ meV, $E_2 = 90$ meV, and $E_3 = 122$ meV and three above-barrier quasibound states at $E_4 = 166$ meV, $E_5 = 272$ meV, and $E_6 = 298$ meV with lifetimes of $\tau_4 = 76$ fs, $\tau_5 = 235$ fs and $\tau_6 = 49$ fs. Other higher energy quasibound states exist but are extremely weak and not of practical interest. The $n = 5$ state is the design upper state and the $n = 4$ state is the lower state. The transport lifetime of the upper state is greater than triple the transport lifetime of the lower state, which will allow population inversion. In addition, the transport lifetime of the lower state is shorter than 100 fs to be less than the carrier relaxation times. [M. Helm and S. J. Allen, *Appl. Phys. Lett.* 56, 1368 (1990). W. H. Knox, C. Hirlimann, D. A. B. Miller, J. Shah, D. S. Chemla, and C. V. Shank, *Phys. Rev.. Lett.* 56, 1191 (1986).] The dipole matrix elements $z_{ij}$ between the states were found by computing the complex wavefunctions $\psi_i$ for each state, and then evaluating $z_{ij} = \int \psi_j z \psi_i dz$. The dipole matrix element for the 4–5 design transition was found to be $4.0 \pm 0.8$ nm, which is extremely large for an intersubband transition but typical of transitions between adjacent higher levels. [L. C. West and S. J. Eglash, *Appl. Phys. Lett.* 46, 1156 (1985).] The uncertainty in the matrix element ($\pm 0.8$ nm) is due to the nonorthogonality of the quasibound states.

Since the structure was to be tested with optical absorption measurements, it was doped in the wells in order to provide carriers for the three bound states. The doping was chosen to be $10^{12}$ cm$^{-2}$ to minimize free-carrier refractive effects. The Fermi level at 300K was calculated to be 77.4 meV. Likewise, the relative two-dimensional populations $N_n/\Sigma N_n$ were found to be 57%, 30%, 10%, and 2% for levels 1, 2, 3, and 4 respectively. The 2% of the population in the 4 state allows for possible observation of the 4–5 transition due to its large dipole matrix element. A square-wave doping profile (FIG. 5) was chosen to compensate for the charge distribution in the three bound states ($n = 1,2,3$). By appropriately adjusting the doping profile, the designed band structure was retained via charge balance and thus a self-consistent algorithm for calculating the wavefunctions was not needed.

For an infrared beam incident at an internal angle $\theta$ from the growth direction z, the beam attenuation is described by the absorption fraction AF where $\mathrm{AF} \equiv -\ln(P_{tr})$ and $P_{tr}$ is the power transmittance through the sample. [J. L. Pan, L. C. West, S. J. Walker, R. J. Malik, and J. F. Walker, *Appl. Phys. Lett.* 57, 366 (1990).] The infrared absorption was measured with a FTIR spectrometer using the zig-zag geometry (FIG. 7) where a six times beam condenser was used to focus the light onto a polished end of the sample. In order to have a large aperture for beam coupling, the sample was polished on opposite sides at a shallow angle of $\theta_p = 17$ deg. The sample was $L = 7.9$ mm long and $d = 503$ $\mu$m thick. The beam was incident on the polished surface at an angle of 45 deg from the z direction. In the zig-zag configuration, the TE and TM polarizations contain the y polarization and a combination of the x–z polarization, respectively. The x polarization can be subtracted out of the x–z data by multiplying the y polarization measurement (TE) by $\cos^2\theta$ and subtracting this result from the x–z polarization measurement (TM). In the zig-zag geometry, the infrared beam makes a multiple number of bounces (B) by total internal reflection inside the sample given by $B = L/d\tan(\theta)$. The absorption fraction in the zig-zag geometry, $\mathrm{AF}^{zz}$, can be written in terms of the single pass AF as $\mathrm{AF}^{zz}(\omega)_{ij} = (\mathrm{AF})(\mathrm{M})\mathrm{B}$, where M is a dimensionless mode factor which is equal to half the average (over the filter) of the square of the z-component of the electric field amplitude divided by the square of the z-component of the incident electric field amplitude. For a single well, M varies from 0 (at a node) to 2 (at an antinode); for many wells, M averages closer to unity. The mode factor was found using a multilayer code that accounts for heterogeneous materials and free electron and intersubband effects on refractive index. For the purpose of measuring the oscillator strength independently of the lineshape, one can integrate out the lineshape dependency to obtain an integrated absorption fraction for each transition, $\mathrm{IAF}_{ij}^{zz}$.

Figure 7:
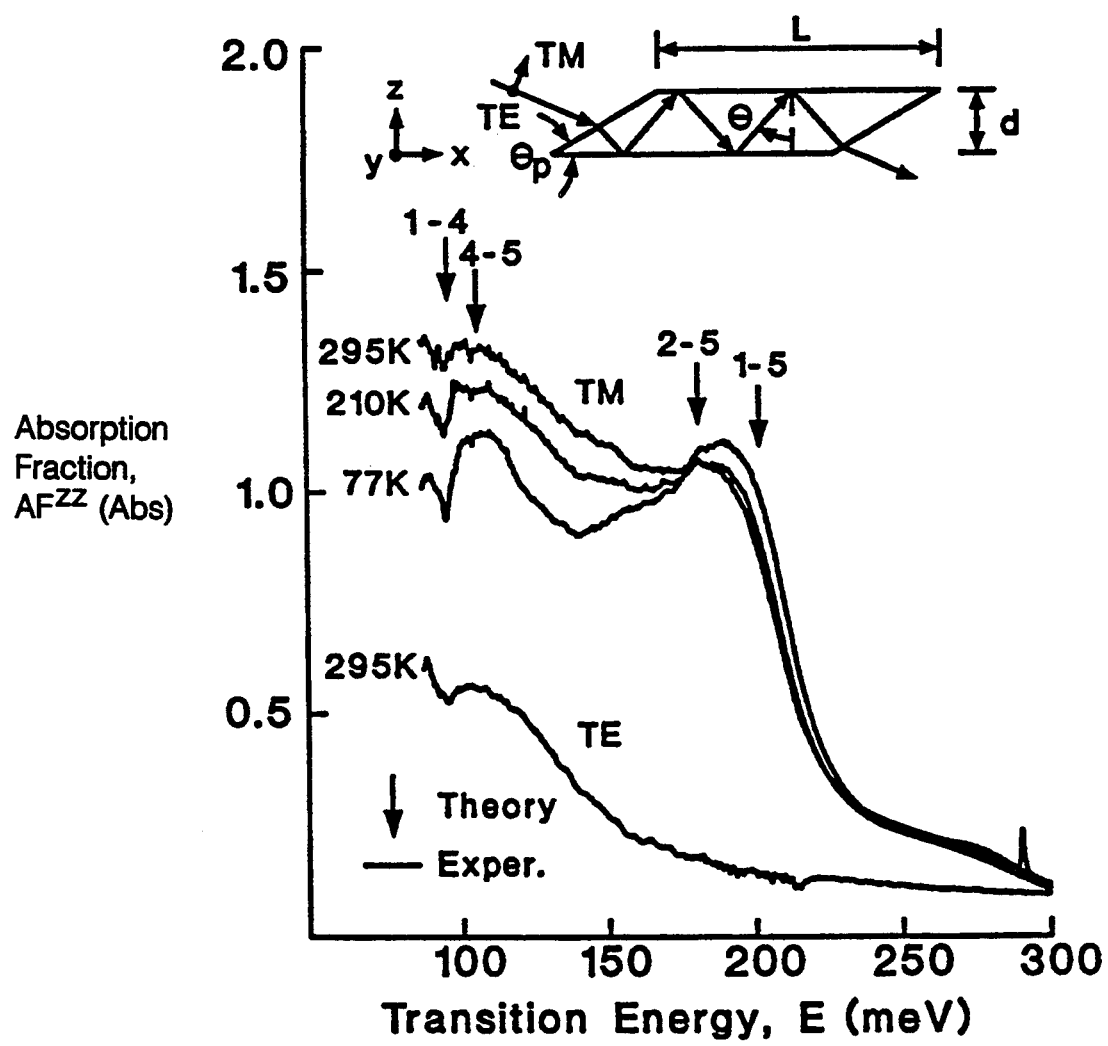
FIG. 7 is a graph of absorption data versus transition energy for an experimental device constructed in accordance with FIG. 6.

The TE and TM polarized zig-zag absorption fractions ($\mathrm{AF}^{zz}$) of the structure are shown in FIG. 7 for a range of temperatures. The large rise in the TM polarized absorption fraction at energies below 225 meV is due to both the indicated (i.e. 1–4 and 1–5) transitions and the Lorentzian tail of the low-energy transitions (i.e. 1–3 and 2–3). The theoretical room-temperature energies of the observable transitions greater than 90 meV are indicated in the figure. Transitions to states with $n \geq 6$ were excluded because the single-pass transport time for these states is comparable to or less than the transport life-time (the ratio of these times is about unity for $n = 6$). In addition, transitions with calculated $\mathrm{IAF}^{zz}$'s less than 0.1 meV were excluded from the figure (i.e. 3–5). At 77K, only the $n = 1$ level is significantly populated. This allows for a clear identification of the peak at about 200 meV as the 1–5 transition. This is the first demonstration of a bound-to-quasibound optical transition in an asymmetric Fabry-Perot electron wave interference filter. The experimental $\mathrm{IAF}^{zz}$ for the 1–5 transition can be calculated by integrating the area under the 1–5 peak at 77K. This integral gives an experimental dipole for the 1–5 transition ranging from 0.7 nm to 0.9 nm (depending on choice of baseline) which is close to the calculated 1–5 dipole of $0.7 \pm 0.01$ nm. The peak at about 110 meV is possibly the 1–4 transition. Definitive identification of this peak is difficult because the spectrometer response inherently becomes inaccurate below about 90 meV and a peak appears at 100 meV in the TE polarization for temperatures below 200K. As the temperature is raised from 77K to 295K, the peak around 200 meV shifts to lower energy. This shift is likely due to the increase in amplitude of the 2-5 transition as a result of the thermal population of the 2 state. In addition, the valley between the 1-4 and 1-5 peaks fills in with increasing temperature. It is speculated that this filling of the valley is due to the 4-5 transition as a result of thermal population of the 4 state. The TE polarized absorption fraction is reasonably insensitive to temperature with the exception of the 100 meV peak discussed above.

In conclusion, our experiments validate the herein described design, analysis, and characterization of an electron-wave Fabry-Perot interference filter with two above-barrier quasibound states for optical transitions. The structure was designed to satisfy the criteria required for population inversion. Optical absorption measurements on the structure demonstrated the first transitions from bound-to-quasibound states in an asymmetric electron wave Fabry-Perot interference filter and provided evidence for a possible quasibound-to-quasibound transition. The design techniques for above-barrier quasibound states discussed in this patent application are applicable to the design of infrared detection as well as emitten. [B. F. Levine, K. K. Choi, C. G. Bethen, J. Walker, and R. J. Malik, *Appl. Phys. Lett.* 50, 1092 (1987).]

A primary advantage of the present invention is that emitters and detectors can be constructed which can operate at a selected wavelength and that the selected wavelength is not tied to the composition of the semiconductor material being used in the device. Rather, the wavelength can be tuned or engineered while using standard, readily available semiconductor materials. This converts what has been a significant materials engineering problem in designing emitters and detectors into a filter design problem, which can be accomplished with techniques borrowed from the field of optics, which provides for tremendous flexibility in choosing operating wavelengths. For example, one can now more easily construct emitters and detectors in the 10 micrometer wavelength range, which has important applications in defense-related components.

Furthermore, the present invention promises greater operating speed, since it does not require the buildup of a charge for operation and should consume very little power since the devices are quite small.

As previously discussed in the Summary, one favorable feature of the invention is the ability to use more ordinary, less hazardous semiconductor materials to construct the devices, virtually irrespective of the operating wavelength. For example, the GaAs and $GaAl_x$-$As_y$ materials disclosed herein are made up of elements from Groups III-V. Heretofore it has not been known to be able to construct emitters, for example in the 10 micrometer operating wavelength range, using these materials. Indeed, previously it often has been necessary to use toxic materials from Groups II-VI to construct 10 micrometer devices.

In addition to the description of "quasibound" electron energy levels provided in the introduction portion of the present application, it should be understood by those skilled in the art in interpreting the appended claims that the term "quasibound" also encompasses levels which may be above all conduction band edges, which may be below one or more of the conduction band edges but above others within the structure, and encompasses levels which may be in the conduction band or the valance band.

While the invention has been described in preferred forms, it will be understood by those skilled in the art that many modifications, additions, and deletions may be made therein. For example, instead of using electrons, it is possible to propagate holes through analogous structures with much the same result (although, in that case, the energy levels are below the valence band edge rather than being above the conduction band edge). For holes the upper energy level must be the less tightly bound state and the lower energy level must be the more tightly bound state. Also, while a laser is depicted, it will be apparent to those skilled in the art that it is a simple matter to make a detector, rather than an emitter, in accordance with the present invention. Also, other types of devices, such as switches and modulators are possible, using the principles set forth herein. These and other modifications, additions, and deletions all fall within the scope and spirit of the invention as set forth in the appended claims.

We claim:

1. A solid state, electronic, optical transition emitter device comprising:
   a multiple-layer structure of semiconductor material which supports substantially ballistic electron transport at energies above the conduction band edge, said multiple-layer structure of semiconductor material comprising filter means for admitting electrons at a first quasibound energy level above the conduction band edge for at least one layer and for depleting electrons at a second quasibound energy level , being lower than said first energy level, said filter means providing for an optical transition from said first quasibound energy level to said second quasibound energy level whereupon light is emitted.

2. A device as claimed in claim 1, wherein said second energy level is less tightly bound than said first energy level.

3. A device as claimed in claim 1, wherein transport lifetimes for electrons at said second energy level are less than associated relaxation times.

4. A device as claimed in claim 1, wherein said filter means comprises a first filter element comprising a potential barrier adapted to admit electrons at a first electron wavelength corresponding to said first energy level, a second filter element comprising at least one layer each having a thickness of one quarter of said first electron wavelength, and a third filter element comprising a layer having a thickness of one half of said first electron wavelength.

5. A device as claimed in claim 4 wherein said third filter element is positioned between said first and said second filter elements.

6. A device as claimed in claim 1, wherein said filter means comprises a Fabry-Perot interference filter.

7. A device as claimed in claim 1 wherein said device is configured as a laser.

8. A device as claimed in claim 1 wherein said device is adapted to operate at a wavelength of about 10 micrometers.

9. A device as claimed in claim 8 wherein said multilayer structure of semiconductor material is comprised of layers of materials made up of Group IV elements or materials made up of Group III-V elements.

10. A device as claimed in claim 1, wherein both quasibound levels are in the conduction band and are above all conduction band edges of the multilayer quantum structure.

11. A device as claimed in claim 1, wherein both quasibound levels are in the conduction band and wherein the first quasibound level is above all conduction band edges and the second quasibound level is below at least one conduction band edge of the multilayer quantum structure.

12. A device as claimed in claim 1, wherein both quasibound levels are in the conduction band and wherein both quasibound levels are below at least one conduction band edge of the multilayer quantum structure.

13. A device as claimed in claim 1, wherein electrons are admitted to the first level by application of a voltage to the device.

14. A device as claimed in claim 1, wherein electrons are admitted to the first level by external optical means.

15. A solid state, optical transition emitter device comprising:
a multiple-layer structure of semiconductor material which supports substantially ballistic hole transport at energies below the valence band edge, said multiple-layer structure of semiconductor material comprising filter means for admitting holes at a first quasibound energy level below the valence band edge for at least one layer and for depleting holes at a second quasibound energy level being higher than said first energy level, said filter means providing for an optical transition from said first quasibound energy level to said second quaisibound energy level whereupon light is emitted.

16. A device as claimed in claim 15, wherein said second energy level is more tightly bound than said first energy level.

17. A device as claimed in claim 15, wherein transport lifetimes for holes at said second energy level are less than associated relaxation times.

18. A device as claimed in claim 15, wherein said filter means comprises a first filter element comprising a potential barrier adapted to admit holes at a first wavelength corresponding to said first energy level, a second filter element comprising at least one layereach having a thickness of one quarter of said first wavelength, and a third filter element comprising a layer having a thickness of one half of said first wavelength.

19. A device as claimed in claim 18 wherein said third filter element is positioned between said first and said second filter elements.

20. A device as claimed in claim 15, wherein said filter means comprises a Fabry-Perot interference filter.

21. A device as claimed in claim 15, wherein both quasibound levels are in the valence band and are below all valence band edges of the multilayer quantum structure.

22. A device as claimed in claim 15, wherein both quasibound levels are in the valence band and wherein the first quasibound level is below all valence band edges and the second quasibound level is below at least one valence band edge of the multilayer quantum structure.

23. A device as claimed in claim 15, wherein both quasibound levels are in the valence band and wherein both quasibound levels are below at least one valence band edge of the multilayer quantum structure.

24. A device as claimed in claim 15, wherein holes are admitted to the first level by application of a voltage to the device.

25. A device as claimed in claim 15, wherein holes are admitted to the first level by external optical means.

26. A solid state, electronic, optical transition detector device comprising:
a multiple-layer structure of semiconductor material which supports substantially ballistic electron transport at energies above the conduction band edge, said multiple-layer structure of semiconductor material comprising filter means for admitting electrons at a first quasibound energy level above the conduction band edge for at least one layer and for depleting electrons at a second quasibound energy level being higher than said first energy level, said filter means providing for an optical transition from said first energy level to said second energy level whereupon light is absorbed.

27. A device as claimed in claim 26, wherein said filter means comprises a first filter element comprising a potential barrier adapted to admit electrons at a first electron wavelength corresponding to said first energy level, a second filter element comprising at least one layer each having a thickness of one quarter of said first electron wavelength, and a third filter element comprising a layer having a thickness of one half of said first electron wavelength.

28. A device as claimed in claim 27, wherein said third filter element is positioned between said first and said second filter elements.

29. A device as claimed in claim 26, wherein said filter means comprises a Fabry-Perot interference filter.

30. A device as claimed in claim 26, wherein said device is adapted to operate at a wavelength of about 10 micrometers.

31. A device as claimed in claim 30, wherein said multi-layer structure of semiconductor material is comprised of layers of materials made up of Group IV elements or materials made up of Group III–V elements.

32. A device as claimed in claim 26, wherein both quasibound levels are in the conduction band and are above all conduction band edges of the multilayer quantum structure.

33. A device as claimed in claim 26, wherein both quasibound levels are in the conduction band and wherein the second quasibound level is above all conduction band edges and the first quasibound level is below at least one conduction band edge of the multilayer quantum structure.

34. A device as claimed in claim 26, wherein both quasibound levels are in the conduction band and wherein both quasibound levels are below at least one conduction band edge of the multilayer quantum structure.

35. A device as claimed in claim 26, wherein electrons are admitted to the first level by application of a current through the device.

36. A device as claimed in claim 26, wherein electrons are admitted to the first level by external optical means.

37. A solid state, optical transition detector device comprising:
a multiple-layer structure of semiconductor material which supports substantially ballistic hole transport at energies below the valence band edge, said multiple-layer structure of semiconductor material comprising filter means for admitting holes at a first quasibound energy level below the valence band edge for at least one layer and for depleting holes at a second quasibound energy level being lower than said first energy level, said filter means providing for an optical transition from said first energy level to said second energy level whereupon light is absorbed.

38. A device as claimed in claim 37, wherein said filter means comprises a first filter element comprising a potential barrier adapted to admit holes at a first wavelength corresponding to said first energy level, a second filter element comprising at least one layer each having a thickness of one quarter of said first wavelength, and a third filter element comprising a layer having a thickness of one half of said first wavelength.

39. A device as claimed in claim 37, wherein said third filter element is positioned between said first and said second filter elements.

40. A device as claimed in claim 37, wherein said filter means comprises a Fabry-Perot interference filter.

41. A device as claimed in claim 37, wherein both quasibound levels are in the valence band and are below all valence band edges of the multilayer quantum structure.

42. A device as claimed in claim 37, wherein both quasibound levels are in the valence band and wherein the second quasibound level is below all valence band edges of the multilayer quantum structure.

43. A device as claimed in claim 37, wherein both quasibound levels are in the valence band and wherein both quasibound levels are below at least one valence band edge of the multilayer quantum structure.

44. A device as claimed in claim 37, wherein holes are admitted to the first level by application of a current through the device.

45. A device as claimed in claim 37, wherein holes are admitted to the first level by external optical means.

* * * * *